(12) United States Patent
Kitahara et al.

(10) Patent No.: US 8,136,422 B2
(45) Date of Patent: Mar. 20, 2012

(54) ARTICULATED ROBOT

(75) Inventors: Yasuyuki Kitahara, Nagano (JP); Shigeyuki Kaino, Nagano (JP)

(73) Assignee: Nidec Sankyo Corporation, Nagano (JP)

( * ) Notice: Subject to any disclaimer, the term of this patent is extended or adjusted under 35 U.S.C. 154(b) by 751 days.

(21) Appl. No.: 11/918,306

(22) PCT Filed: Apr. 11, 2006

(86) PCT No.: PCT/JP2006/307626
§ 371 (c)(1), (2), (4) Date: Dec. 30, 2008

(87) PCT Pub. No.: WO2006/109791
PCT Pub. Date: Oct. 19, 2006

(65) Prior Publication Data
US 2009/0095111 A1    Apr. 16, 2009

(30) Foreign Application Priority Data

Apr. 11, 2005 (JP) ................................ 2005-114028
Dec. 5, 2005 (JP) ................................ 2005-350921

(51) Int. Cl.
*B25J 18/00* (2006.01)
*B25J 17/02* (2006.01)
*B25J 9/22* (2006.01)

(52) U.S. Cl. ................ 74/490.1; 318/568.21; 414/744.5
(58) Field of Classification Search ............... 74/490.01, 74/490.02, 490.05, 490.06, 490.1; 414/744.5, 414/918, 749; 318/568.21, 568.11, 568.15, 318/573; 901/9, 45, 8, 11–15, 27–29
See application file for complete search history.

(56) References Cited

U.S. PATENT DOCUMENTS

| 4,505,049 | A  | * | 3/1985  | Kuno et al. ..................... 33/333 |
| 6,326,755 | B1 | * | 12/2001 | Babbs et al. ............. 318/568.21 |
| 7,086,822 | B2 |   | 8/2006  | Maeda |
| 7,946,800 | B2 | * | 5/2011  | Hosek et al. ............... 414/744.5 |

FOREIGN PATENT DOCUMENTS

| JP | 11-138474   | 5/1999 |
| JP | 2002-164402 | 6/2002 |
| JP | 2003-170384 | 6/2003 |
| JP | 2003-220586 | 8/2003 |

* cited by examiner

*Primary Examiner* — Robert Pezzuto
(74) *Attorney, Agent, or Firm* — Frommer Lawrence & Haug LLP

(57) ABSTRACT

A multi-joint robot for loading/unloading a work into/from a cassette, which includes a hand part holding the work, an arm part rotatably holding the hand part, a link mechanism rotatably holding the base end side of the arm part and moving so that the moving route of the base end side of the arm part becomes linear in a direction roughly orthogonal to a direction for loading/unloading the work, and a driving device for moving the tip side of the arm part so as to linearly interpolate it in a direction for loading/unloading the work according to the movement of the link mechanism.

4 Claims, 9 Drawing Sheets

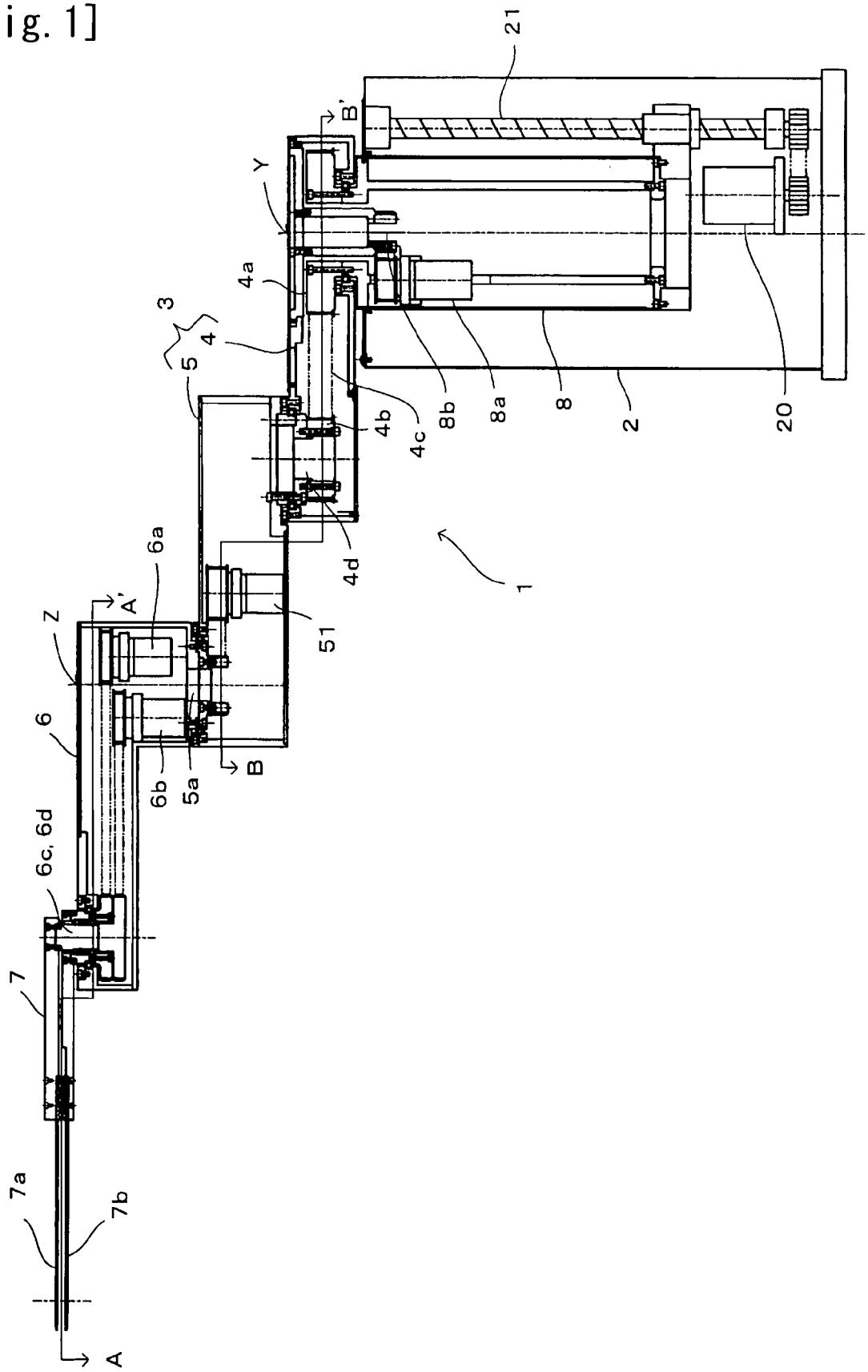
[Fig. 1]

[Fig. 2]
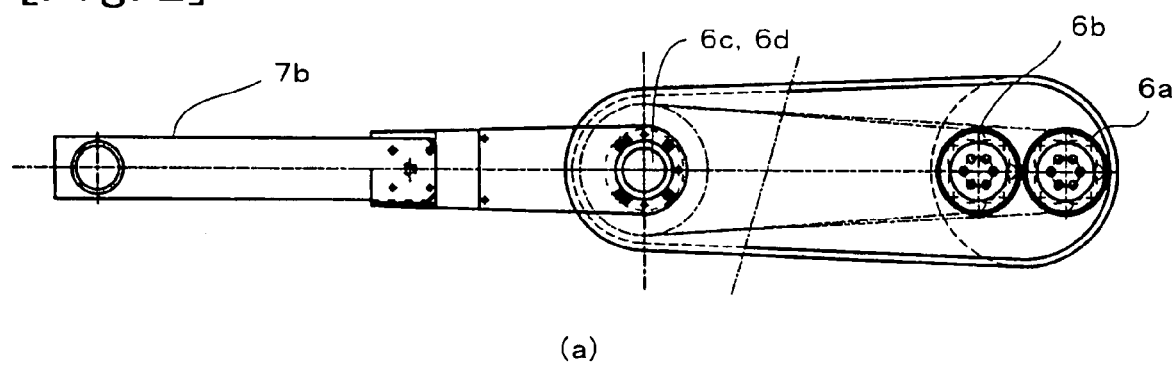
(a)
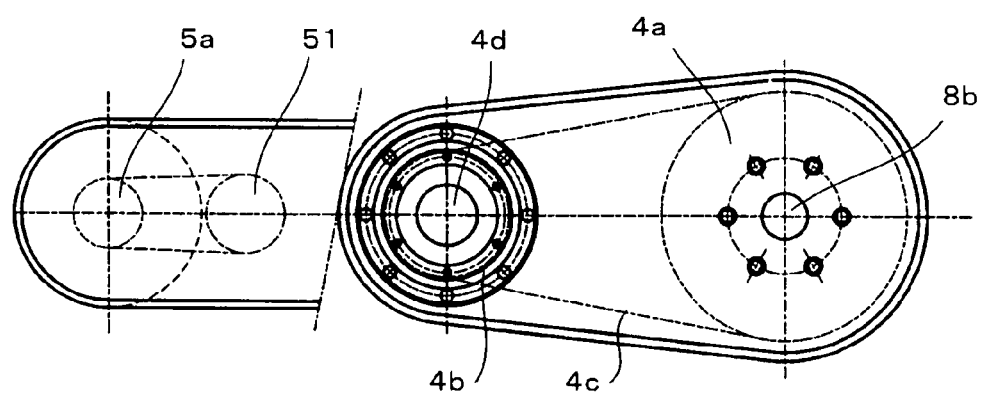
(b)

[Fig. 3]
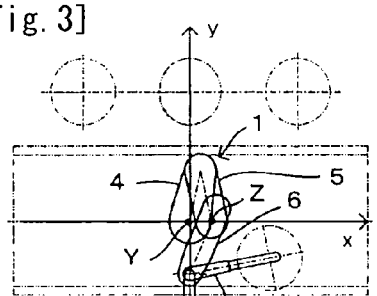
(a)
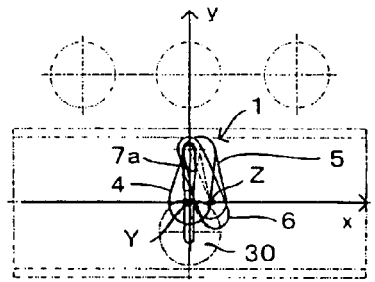
(b)
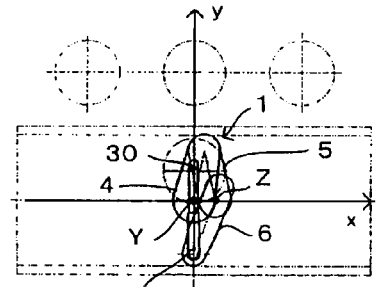
(c)
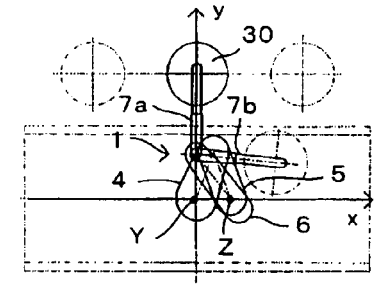
(d)

[Fig. 4]
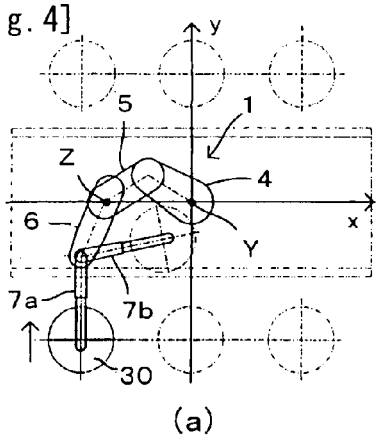
(a)
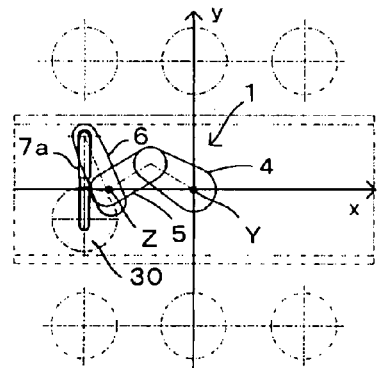
(b)
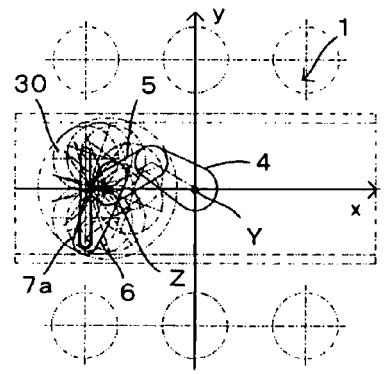
(c)
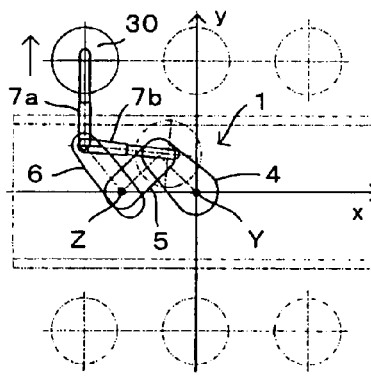
(d)

[Fig. 5]
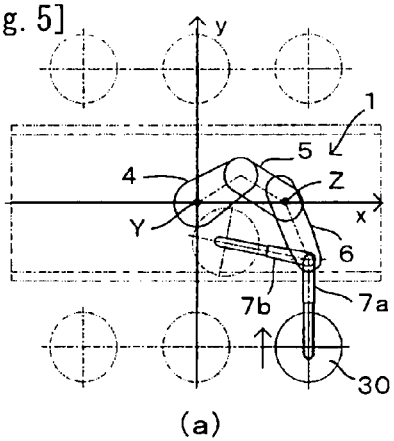
(a)
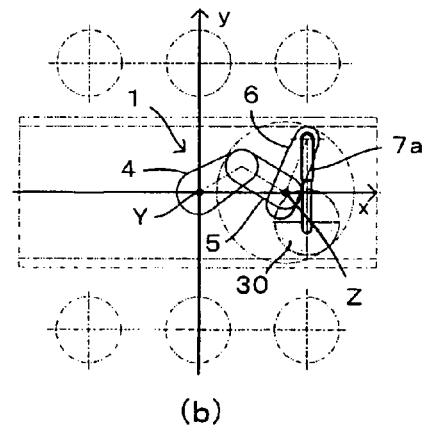
(b)
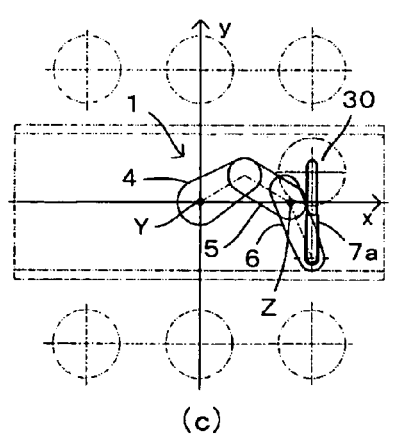
(c)
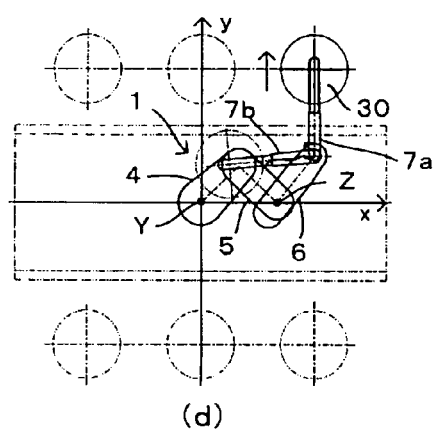
(d)

[Fig. 6]
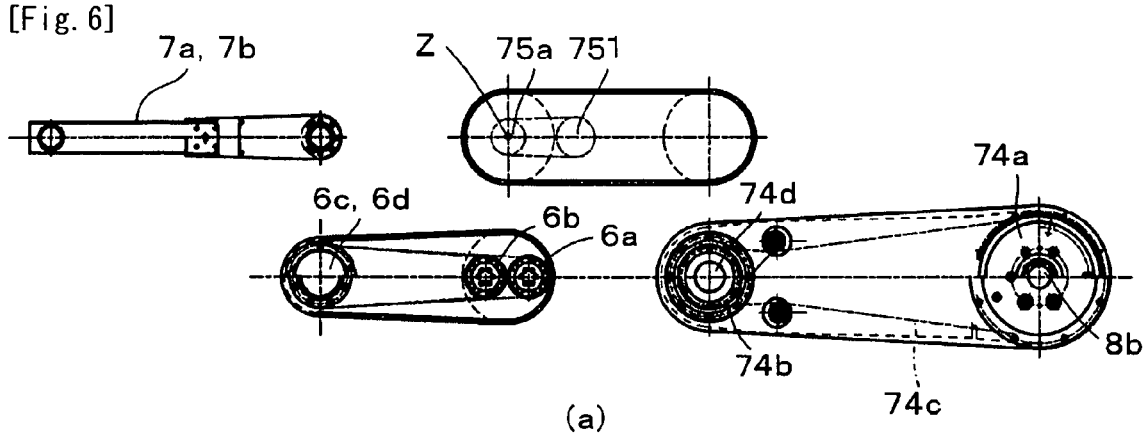
(a)
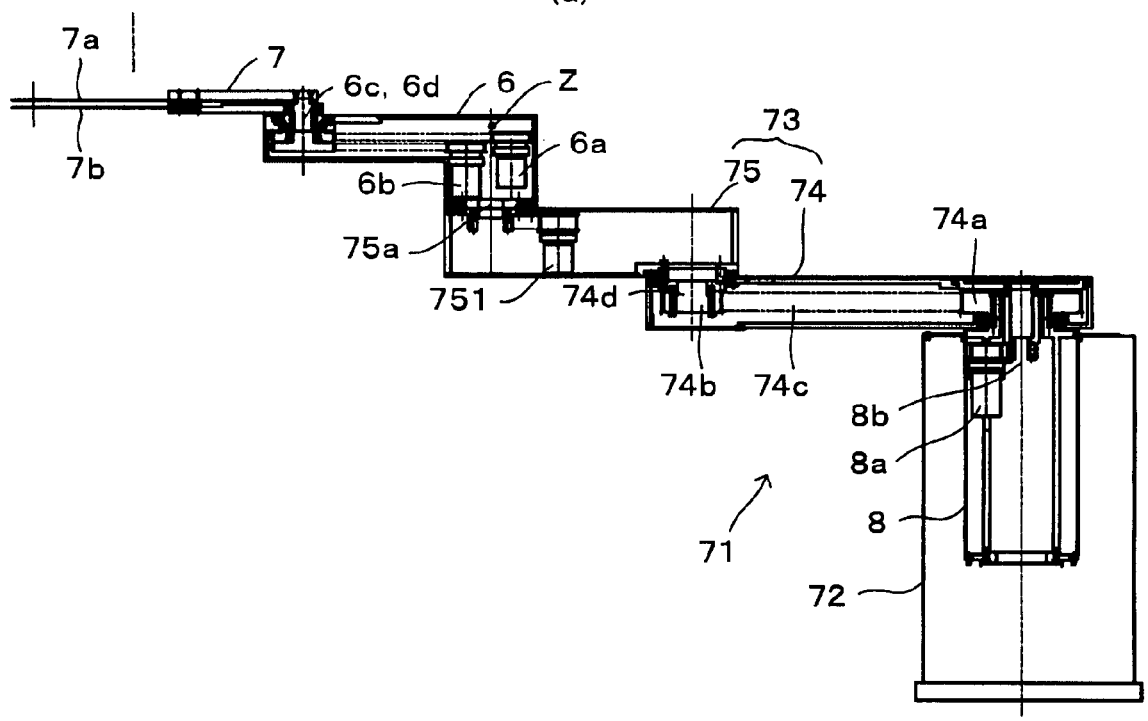
(b)

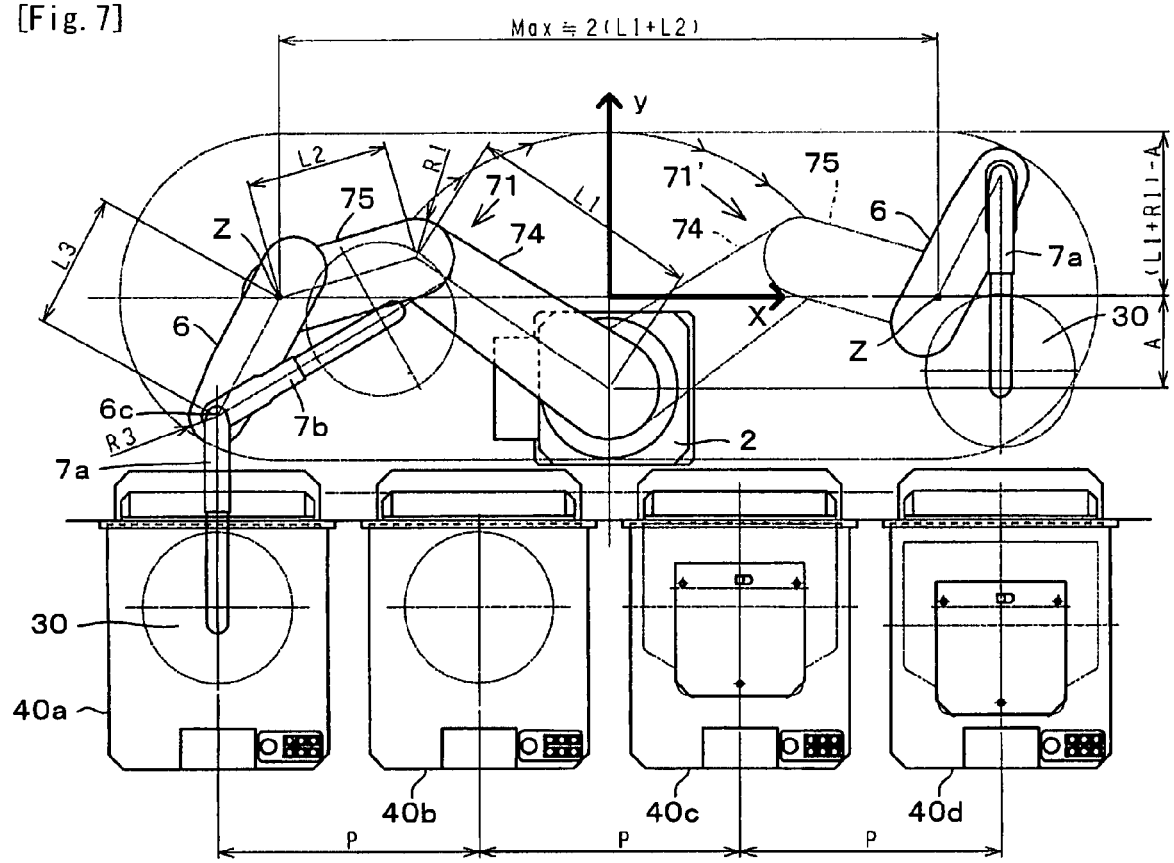
[Fig. 7]

[Fig. 8]
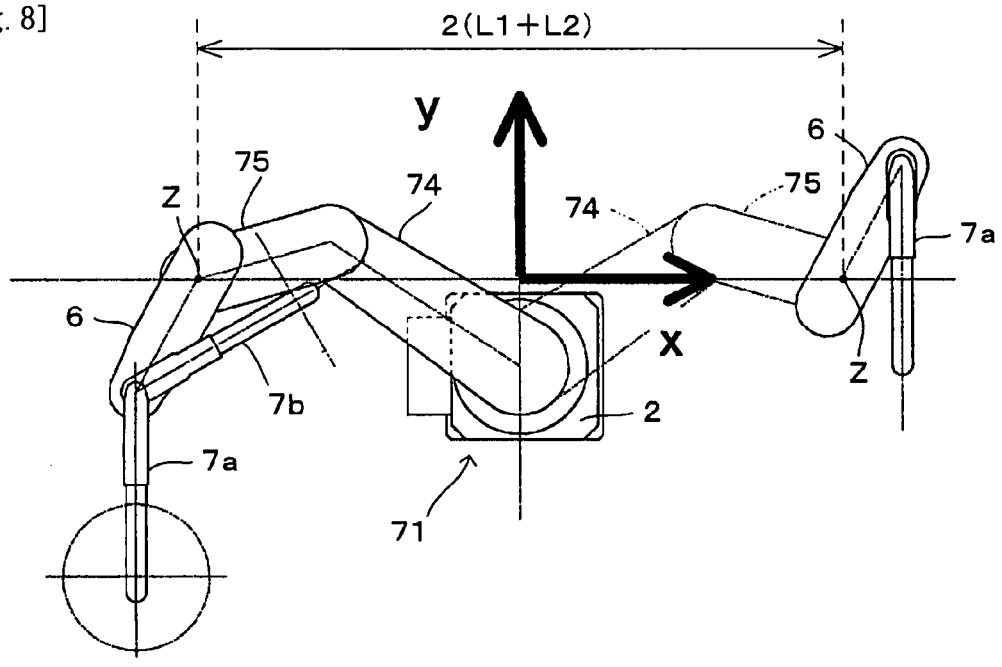
(a)
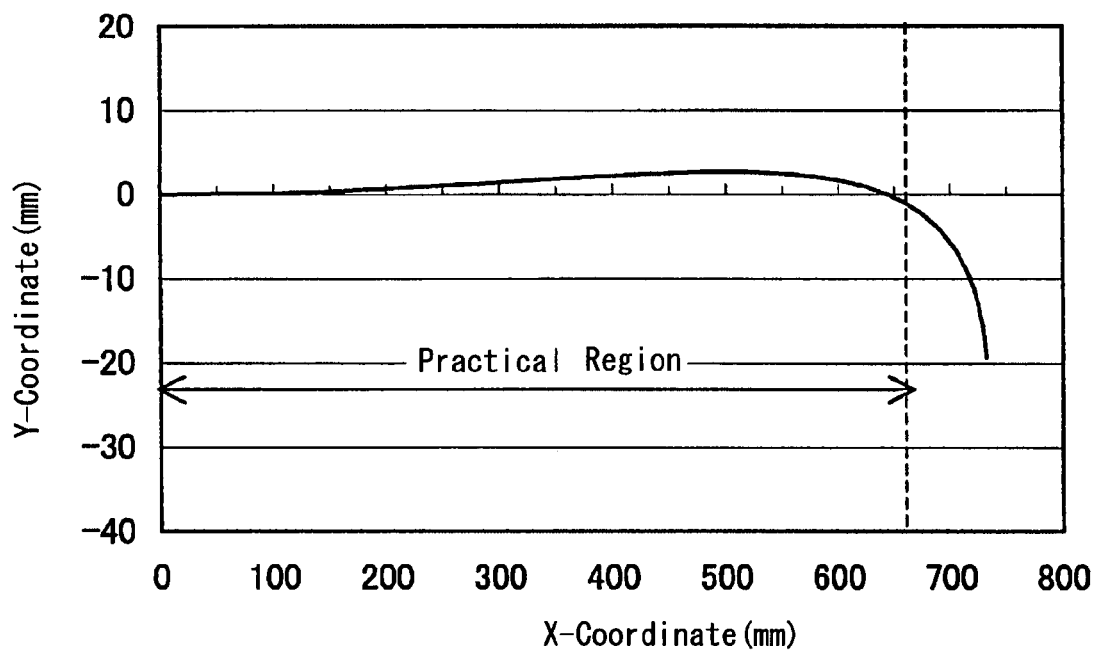
(b)

[Fig. 9]
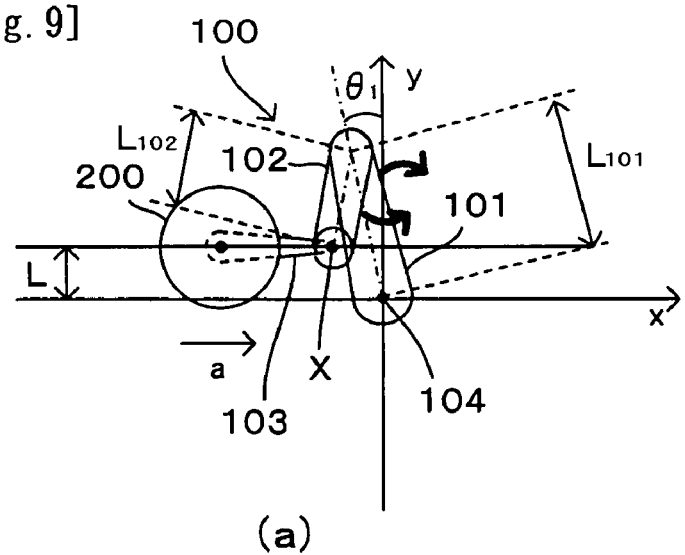
(a)
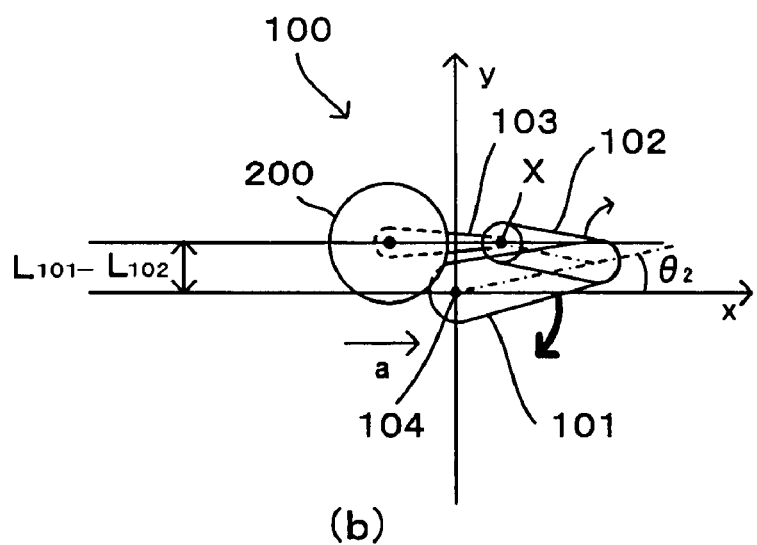
(b)
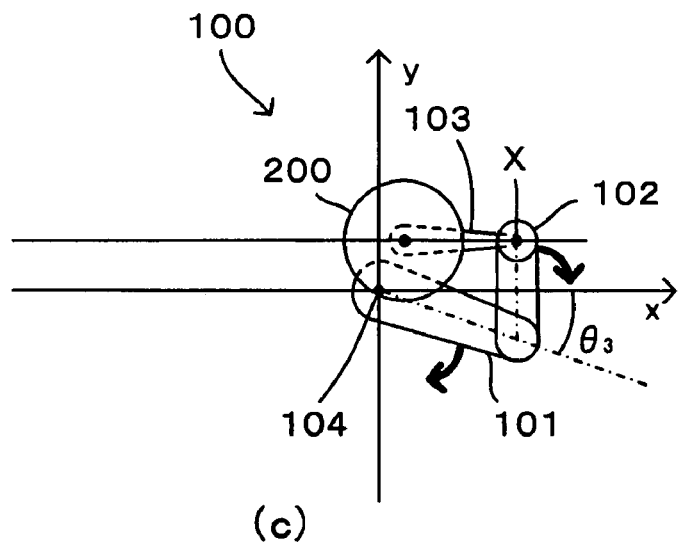
(c)

ARTICULATED ROBOT

BACKGROUND OF THE INVENTION

1. Field of the Invention

The present invention relates to an articulated robot which is used to load/unload a work-piece to/from a cassette. Specifically, the present invention relates to an articulated robot which is capable of performing a stable operation with linear interpolation.

2. Description of Related Art

In order to load/unload a large work-piece such as a semiconductor wafer to/from a cassette, an articulated robot is used in which a plurality of arms is turnably connected with each other to perform extensible operation or the like by transmitting a rotating force of a rotating drive source.

For example, there is a SCARA (Selective Compliance Assembly Robot Arm) type robot as described in Japanese Patent Laid-Open No. 2003-170384. This robot realizes bending and stretching of an arm body (first arm and second arm) by turning the first arm and the second arm in a horizontal plane. Further, loading/unloading of a work-piece is performed by means of that a hand part turnably held at a tip end of the second arm is advanced and retreated to and from the cassette.

According to the SCARA type robot as described in Japanese Patent Laid-Open No. 2003-170384, there is a merit that an installation space for a running axis (rail or the like for running a base in a horizontal direction on which a plurality of arms is installed) is not required, which is different from a case that a cylindrical coordinate type robot is used.

However, in the conventional SCARA type robot, when the first arm and the second arm are controlled with linear interpolation (in other words, when one point on an arm is controlled to be linearly moved), an angular velocity of the second arm is rapidly changed due to overlapping of the two arms and thus carrying of a semiconductor wafer may be unstable. More specifically, it will be described below with reference to FIG. 9.

FIG. 9 is an explanatory view showing states in which the first arm 101 and the second arm 102 are controlled with linear interpolation in a conventional SCARA type robot 100. In FIG. 9(a), the conventional SCARA type robot 100 includes a first arm 101 whose base end part 104 is mounted on a base (not shown), a second arm 102 which is connected with a tip end part of the first arm 101, and a hand part 103 which is connected with a tip end part of the second arm 102. The hand part 103 supports a work-piece (object to be carried) 200.

In order to move the work-piece 200 in an "a" direction (the "X"-axis direction in the X-Y coordinate system), it is assumed that the first arm 101 and the second arm 102 are controlled with linear interpolation (in other words, a case that a tip end part "X" of the second arm 102 is linearly moved in the "a" direction). When the second arm 102 is turned in a counterclockwise direction around the tip end part of the first arm 101 while the first arm 101 is turned in a clockwise direction around the base end portion 104, the work-piece 200 is linearly moved in the "a" direction.

In this robot 100, when an effective length of the first arm 101 is set to be "$L_{101}$" and an effective length of the second arm 102 is set to be "$L_{102}$" (see FIG. 9(a)), an attitude in which an angle formed by the first arm 101 and the second arm 102 becomes 0° becomes a singular point. When linear interpolation is performed to pass the vicinity of the singular point, in other words, when "L" shown in FIG. 9(a) traces a trajectory of a value close to ("$L_{101}$"-"$L_{102}$"), the first arm 101 and the second arm 102 are turned as shown from FIG. 9(a) to FIG. 9(b). After that, as shown in FIGS. 9(b) and 9(c), the second arm 102 is turned with angular velocity in a clockwise direction around the tip end part of the first arm 101. On the other hand, the first arm 101 is always turned in the clockwise direction around the base end part 104 in FIG. 9(a) through FIG. 9(c).

In FIG. 9, in order to carry the work-piece 200 stably, a carrying speed in the "a" direction of the work-piece 200 is set to be constant (a carrying distance in the "a" direction of the work-piece 200 (moving distance of the tip end part "X" of the second arm 102) from FIG. 9(a) to FIG. 9(b) is set to be substantially the same as that from FIG. 9(b) to FIG. 9(c)). When paying attention to a turning angle of the first arm 101, the turning angle from FIG. 9(a) to FIG. 9(b) is about 90°-$\theta_2$ ($\theta_1$ is regarded as about 0°) and the turning angle from FIG. 9(b) to FIG. 9(c) is $\theta_2+\theta_3$. In these turning angles, the angle of about 90°-$\theta_2$ from FIG. 9(a) to FIG. 9(b) is obviously large. In other words, in order to set a carrying speed in the "a" direction of the work-piece 200 to be constant when the tip end part "X" of the second arm 102 is moved near the singular point, an angular velocity of the first arm 101 is required to be rapidly (at a high speed) changed with the base end part 104 of the first arm as the singular point. This may cause vibration to the first arm 101 and the second arm 102 and thus carrying of the work-piece 200 may be unstable.

Further, in order to rapidly change (at a high speed) the angular velocity of the first arm 101, a remarkably large driving force (torque) is required. However, in order to realize this requirement, an expensive motor is required and, as a result, manufacturing cost may be increased.

With respect to this point, according to the articulated robot disclosed in Japanese Patent Laid-Open No. Hei 11-138474, it can be structured that the singular point is not generated during carrying of the work-piece. In other words, in this articulated robot, a first turning shaft is formed at an eccentric position to the center of rotation of a rotary table to structure the rotary table as a first arm part and an arm which is turnably held around the first turning shaft is structured as a second arm part, a third arm part is turnably held at a tip end of the second arm part, and a hand part is turnably held at a tip end of the third arm part. In addition, the first arm part, the second arm part, the third arm part and the hand part are respectively turned and controlled so as not to generate the singular point. However, this "turning and controlling respectively" becomes a complicated control due to a lot of control parameters, and a great deal of labor is required to prepare the control program.

In view of the problems described above, an object of the present invention is directed to provide an articulated robot which is capable of stably carrying a work-piece with simple control without using an expensive motor generating a large driving force.

SUMMARY OF THE INVENTION

In order to solve the problems as described above, the present invention provides the following:

(1) An articulated robot for loading/unloading a work-piece in/from a cassette comprising a hand part for holding the work-piece, an arm part which turnably holds the hand part, a link mechanism which turnably holds a base end side of the arm part and which operates to cause a moving trajectory of the base end side of the arm part to form a straight line in a direction substantially perpendicular to a loading/unloading direction, and a drive means for moving the arm part so as to perform linear interpolation in the loading/unloading direction while matching with movement of the link mechanism.

According to the present invention, an articulated robot includes a hand part for holding a work-piece, an arm part which turnably holds the hand part, a link mechanism which turnably holds a base end side of the arm part and which operates to cause a moving trajectory of the base end side of the arm part to form a straight line in a direction substantially perpendicular to a loading/unloading direction, and a drive means (for example, a motor) for moving the arm part (or a tip end side of the arm part) so as to perform linear interpolation in the loading/unloading direction while matching with movement of the link mechanism. Therefore, a work-piece such as a semiconductor wafer can be carried stably. In other words, even when the arm part is moved so as to perform linear interpolation, since the base end side of the arm part is controlled to move to optimal positions, rapid speed variation of the arm part and the link mechanism is not required (singular point is not generated). Therefore, occurrence of vibration in the arm part and the link mechanism can be prevented and thus the work-piece can be carried stably.

Further, since rapid speed variation of the arm part and the link mechanism is not required, the work-piece can be carried stably without using an expensive motor generating a large driving force. In addition, in the articulated robot disclosed in Japanese Patent Laid-Open No. Hei 11-138474, the first arm part, the second arm part, the third arm part and the hand part are required to be respectively turnably controlled. However, according to the present invention, it is sufficient that the link mechanism, the arm part and the hand part are turnably controlled. Therefore, the number of control parameters can be reduced (as a result, labor for preparing the control program can be reduced) and thus the work-piece can be carried stably with a simple control.

In the conventional SCARA type robot 100 (see FIG. 9), in order to carry the work-piece 200 at a constant carrying speed, a rapid speed variation of the first arm 101 is required (see FIG. 9(b)→FIG. 9(c)). However, when the first arm 101 is turned at a speed more than a predetermined angular velocity, there is a possibility that the SCARA type robot 100 itself results in failure and thus processing for preventing the speed of the first arm 101 from exceeding is adopted. However, according to the articulated robot in accordance with the present invention, since the special processing described above is not required, manufacturing cost can be greatly reduced.

(2) The articulated robot according to the above-mentioned (1), wherein the link mechanism includes a base side link part which is disposed on an base end side of the articulated robot and an arm side link part which is disposed on a side of the arm part and which is connected with the base side link part, and lengths of the base side link part and the arm side link part are substantially the same, and a turning angle ratio between the base side link part and the arm side link part is 1:2.

According to the present invention, the link mechanism described above includes a base side link part which is disposed on an base end side of the articulated robot and an arm side link part which is disposed on a side of the arm part and which is connected with the base side link part, and both lengths are substantially the same (substantially equal to each other), and a turning angle ratio of the both parts is set to be 1:2. Therefore, the base end side of the arm part is always adequately controlled on a predetermined straight line and rapid speed variations of the arm part and the link mechanism are not required and thus the work-piece can be carried stably.

With regard to this point, when a running axis for running the base in a horizontal direction is provided in the conventional cylindrical coordinate system robot, it is possible to move the connection point linearly. However, when the running axis is provided, its installation space is required and, in addition, components which may be dust generation parts such as a rail are required and thus it is not suitable to be used in a clean room. On the other hand, according to the articulated robot in accordance with the present invention, components which may be dust generation parts such as a rail are not required, the articulated robot in accordance with the present invention can be used in a clean room adequately.

(3) The articulated robot according to the above-mentioned (1), wherein the link mechanism includes a base side link part which is disposed on an base end side of the articulated robot and an arm side link part which is disposed on a side of the arm part and which is connected with the base side link part, and a length of the base side link part is formed longer than a length of the arm side link part, and a base of the link mechanism is disposed in a state that a center position of the base of the link mechanism is shifted from the moving trajectory of the base end side of the arm part.

According to the present invention, the link mechanism described above includes a base side link part which is disposed on an base end side of the articulated robot and an arm side link part whose length is longer than a length of the arm side link part and which is disposed on the base end side and connected with the base side link part, and a base of the link mechanism is disposed in a state that a center position of the base of the link mechanism is shifted from the moving trajectory of the base end side of the arm part. Therefore, a work-piece can be carried stably.

In other words, even when the arm part is moved to perform linear interpolation, since the base end side of the arm part is controlled to move to optimal positions, rapid speed variation of the arm part and the link mechanism is not required (singular point is not generated). Therefore, occurrence of vibration in the arm part and the link mechanism can be prevented and thus the work-piece can be carried stably.

Further, the present invention is provided with an excellent merit because improvement of efficiency and downsizing can be realized simultaneously. More specifically described, in recent years, there is a case that a plurality of cassettes is disposed in a direction perpendicular to a loading/unloading direction of a work-piece to/from a cassette in order to enhance efficiency of carrying the work-piece. In this case, it is possible to cope with the case by making lengths of respective portions such as the base side link part and the arm side link part simply longer. However, when the lengths of the respective portions are simply made longer, turning ranges of the respective portions become larger. Therefore, a useless space occurs and demand of downsizing in recent years cannot be satisfied. Especially, the articulated robot is often installed in a clean room at a generally high cost and thus it is required to shorten an occupation distance in the loading/unloading direction of a work-piece to/from a cassette as short as possible. Accordingly, in the articulated robot in accordance with the present invention, since the length of the base side link part is set to be longer than the length of the arm side link part, it is possible to cope with a plurality of cassettes which are respectively disposed adjacent to each other to realize improvement of efficiency. In addition, the base of the link mechanism is disposed in a state that its center position is shifted from the moving trajectory of the base end side of the arm part. Therefore, an occupation distance in the loading/unloading direction of a work-piece to/from a cassette is shortened to realize downsizing.

Further, the length of the base side link part is set to be longer than the length of the arm side link part. Therefore, it is possible to move faster to a cassette on both ends of a plurality of cassettes which is, for example, respectively disposed adjacent to each other. Moreover, in an articulated robot, there is a request that weight is decreased along with closer to the tip end in order to carry a work-piece stably. With regard to this point, in the articulated robot in accordance with the present invention, since the length of the arm side link part is shorter than the length of the base side link part, stable carrying of a work-piece can be attained.

Further, since rapid speed variation of the arm part and the link mechanism is not required, the work-piece can be carried stably without using an expensive motor generating a large driving force. In addition, in the articulated robot disclosed in Japanese Patent Laid-Open No. Hei 11-138474, the first arm part, the second arm part, the third arm part and the hand part are required to be respectively turnably controlled. However, according to the present invention, it is sufficient that the link mechanism, the arm part and the hand part are turnably controlled respectively. Therefore, the number of axes can be reduced and it is manufactured at a low cost. Further, since the number of control parameters is reduced, labor for preparing the control program can be reduced and thus the work-piece can be carried stably with a simple control.

Further, in the conventional SCARA type robot 100 (see FIG. 9), when the work-piece 200 is to be carried at a constant carrying speed, a rapid speed variation of the first arm 101 is required (see FIG. 9(b)→FIG. 9(c)). However, when the first arm 101 is turned at a speed more than a predetermined angular velocity, there is a possibility that the SCARA type robot 100 itself results in failure and thus processing for preventing the speed of the first arm 101 from exceeding is adopted. However, according to the articulated robot in accordance with the present invention, the special processing described above is not required and thus manufacturing cost can be greatly reduced.

(4) The articulated robot according to the above-mentioned (3), wherein the base of the link mechanism is disposed in a state that the center position of the base of the link mechanism is shifted on a side to the cassette or on a side to a target position where the work-piece is carried in or carried out from the moving trajectory of the base end side of the arm part.

According to the present invention, the base of the link mechanism described above is disposed in a state that the center position of the base of the link mechanism is shifted on a side to the cassette or on a side to a target position where the work-piece is carried in or carried out from the moving trajectory of the base end side of the arm part. Therefore, the work-piece can be stably carried while shortening an occupation distance in the loading/unloading direction to/from a cassette or on a side to a target position where the work-piece is carried in or carried out. Further, the base end side of the arm part can be always adequately controlled on a predetermined straight line and rapid speed variations of the arm part and the link mechanism are not required and thus the work-piece can be carried stably.

With regard to this point, when a running axis for running the base in a horizontal direction is provided in the conventional cylindrical coordinate system robot, it is possible to move the connection point linearly. However, when the running axis is provided, its installation space is required and, in addition, components which may be dust generation parts such as a rail are required and thus it is not suitable to be used in a clean room. On the other hand, according to the articulated robot in accordance with the present invention, components which may be dust generation parts such as a rail are not required, the articulated robot can be used in a clean room adequately.

As described above, according to the present invention, occurrence of vibration in the arm part and the link mechanism can be prevented and thus the work-piece can be carried stably. Further, the work-piece can be carried stably without using an expensive motor generating a large driving force. In addition, special processing for preventing the speed of the arm part or the link mechanism from exceeding is not required and thus it is remarkably effective to reduce manufacturing cost.

BRIEF DESCRIPTION OF THE DRAWINGS

FIG. 1 is a longitudinal sectional view showing an articulated robot in accordance with an embodiment of the present invention.

FIG. 2 is a transverse cross-sectional view showing the articulated robot shown in FIG. 1.

FIG. 3 is an explanatory view for explaining a mechanical operation of an articulated robot in accordance with an embodiment of the present invention.

FIG. 4 is an explanatory view for explaining another mechanical operation of an articulated robot in accordance with an embodiment of the present invention.

FIG. 5 is an explanatory view for explaining another mechanical operation of an articulated robot in accordance with an embodiment of the present invention.

FIG. 6 is a sectional view showing an articulated robot in accordance with another embodiment of the present invention.

FIG. 7 is an explanatory view for explaining a mechanical operation of an articulated robot in accordance with another embodiment of the present invention.

FIG. 8 is an explanatory view for explaining linearity of a connection point in an articulated robot in accordance with another embodiment of the present invention.

FIG. 9 is an explanatory view for explaining a manner in which a first arm and a second arm are controlled with linear interpolation in a conventional SCARA type robot.

DETAILED DESCRIPTION OF EMBODIMENTS

Referring now to the drawings, the present invention will be described in detail on the basis of a first embodiment.

FIG. 1 is a longitudinal sectional view showing an articulated robot 1 in accordance with an embodiment of the present invention. Further, FIG. 2 is a transverse cross-sectional view showing the articulated robot 1 shown in FIG. 1. Especially, FIG. 2(a) is a cross-sectional view along the "A-A" line in FIG. 1 and FIG. 2(b) is a cross-sectional view along the "B-B'" line in FIG. 1.

In FIG. 1 and FIG. 2, an articulated robot 1 includes a base 2, a link mechanism 3, an arm part 6 and a hand part 7. The link mechanism 3 is provided with a base side link part 4 and an arm side link part 5 which are turnably connected with each other and have the same length.

The base 2 includes an elevating/lowering motor 20, a guide shaft 21 which is rotated by the elevating/lowering motor 20 and in which a vertical direction is set to be its longitudinal direction, and an elevating/lowering cylinder 8 which is guided by the guide shaft 21 to move up and down in the vertical direction.

The base side link part 4 is connected with the elevating/lowering cylinder 8 through a connecting shaft 8b and held so as to be capable of turning by a link mechanism motor 8a which is built in the elevating/lowering cylinder 8. Further, the base side link part 4 is moved up and down with respect to the base 2 along with the elevating/lowering cylinder 8 which moves up and down.

A base side pulley 4a, an arm side pulley 4b and a belt 4c are built in the base side link part 4. Also, a ratio of diameters of the base side pulley 4a and the arm side pulley 4b is set to be 2:1. Further, the arm side pulley 4b and the arm side link part 5 are connected with each other by the connecting shaft 4d. Therefore, a turning angle ratio between the base side pulley 4a and the arm side pulley 4b, in other words, a turning angle ratio between the base side link part 4 and the arm side link part 5 is 1:2. As a result, in the link mechanism 3, a center point (fixed point "Y") of the base side pulley 4a in the base side link part 4 and a center point (connection point "Z") of the connecting shaft 5a which turnably connects the arm side link part 5 with the arm part 6 are always controlled on a predetermined straight line.

The arm part 6 is connected with the tip end of the arm side link part 5 through the connecting shaft 5a and held so as to be capable of turning by an arm part motor 51 which is built in the arm side link part 5. In FIG. 1, for convenience of description, the arm part motor 51 is built in the arm side link part 5 but the present invention is not limited to this structure. For example, the arm part motor 51 may be built in the arm part 6 or it may be disposed anywhere. The hand part 7 is structured of an upper support frame 7a and a lower support frame 7b which are disposed in parallel to each other. The upper support frame 7a and the lower support frame 7b are connected with the tip end of the arm part 6 through a connecting shaft 6c and a connecting shaft 6d respectively and they are held so that they can be turned by a lower support frame motor 6a and an upper support frame motor 6b which are respectively built in the arm part 6.

In this embodiment, control signals for driving the elevating/lowering motor 20, the link mechanism motor 8a, the arm part motor 51, the lower support frame motor 6a and the upper support frame motor 6b are appropriately transmitted from a computer (not shown) on the basis of programs having been inputted by an operator.

FIG. 3 is an explanatory view for explaining a mechanical operation of the articulated robot 1 in accordance with an embodiment of the present invention. In FIG. 3, an operation will be described in which a work-piece (for example, a circular semiconductor wafer) 30 is taken out from a lower cassette in the drawing to put in an upper cassette in the drawing.

In FIG. 3(*a*), the work-piece 30 is placed on the tip end of the upper support frame 7a of the hand part 7. The lower support frame 7b of the hand part 7 is not used in this operation and thus it is set in a bent state as shown in the drawing.

The upper support frame 7a of the hand part 7 is linearly moved in a positive direction of the "y"-axis while keeping its orientation in order to take out the work-piece 30 from the lower cassette in the drawing. More specifically, the arm part 6 is turned in a clockwise direction around the connection point "Z" by the arm part motor 51 and the upper support frame 7a of the hand part 7 is turned in a counterclockwise direction around the connecting shaft 6c by the upper support frame motor 6b. In this case, a moving trajectory of the connection point "Z" becomes a straight line in a direction perpendicular to an unloading direction of the work-piece 30 (the "x"-axis direction).

After that, when the upper support frame 7a of the hand part 7 has been moved upward by a predetermined distance in the drawing, taking out of the work-piece 30 is completed (FIG. 3(*b*)). Next, the arm part 6 is turned in the clockwise direction around the connection point "Z" by a predetermined angle together with the upper support frame 7a of the hand part 7. As a result, the orientation of the upper support frame 7a of the hand part 7 is reversed by 180° from a downward orientation to an upward orientation (FIG. 3(*c*)). In this embodiment, in FIG. 3(*b*) and FIG. 3(*c*), the lower support frame 7b is overlapped with the upper support frame 7a and performs the same operation as the upper support frame 7a.

Lastly, the arm part 6 is turned in the clockwise direction around the connection point "Z" by the arm part motor 51 and the upper support frame 7a of the hand part 7 is turned in the counterclockwise direction around the connecting shaft 6c by the upper support frame motor 6b. As a result, the work-piece 30 is placed in the upper cassette in the drawing (FIG. 3(*d*)). In this embodiment, in FIG. 3(*d*), similarly to FIG. 3(*a*), the lower support frame 7b of the hand part 7 is set to be a bent state as shown in the drawing.

FIG. 4 and FIG. 5 are explanatory views for explaining another mechanical operation of the articulated robot 1 in accordance with an embodiment of the present invention. In FIG. 4 and FIG. 5, operations will be described in which work-pieces (a circular semiconductor wafer) 30 are respectively taken out from left and right side lower cassettes in the drawing by the articulated robot 1 and are respectively placed in left and right side upper cassettes in the drawing.

In FIG. 4(*a*), in the articulated robot 1, the work-piece 30 is placed on the tip end of the upper support frame 7a of the hand part 7. Next, similar to the case described with reference to FIG. 3(*b*) through FIG. 3(*d*), the arm part 6 is turned in a clockwise direction around the connection point "Z" by the aim part motor 51, and the upper support frame 7a of the hand part 7 is turned in a counterclockwise direction around the connecting shaft 6c by the upper support frame motor 6b. As a result, taking out of the work-piece 30 is completed (FIG. 4(*b*)). After that, the arm part 6 is turned in the counterclockwise direction around the connection point "Z" by a predetermined angle together with the upper support frame 7a of the hand part 7 in an integral manner and the orientation of the upper support frame 7a of the hand part 7 is reversed by 180° from a downward orientation to an upward orientation (FIG. 4(*c*)). Lastly, the arm part 6 is turned in a clockwise direction around the connection point "Z" by the arm part motor 51 and the upper support frame 7a of the hand part 7 is turned in a counterclockwise direction around the connecting shaft 6c by the upper support frame motor 6b. As a result, the work-piece 30 is placed in a left side upper cassette in the drawing (FIG. 4(*d*)).

On the other hand, in FIG. 5(*a*), in the articulated robot 1, a work-piece 30 is placed on the tip end of the upper support frame 7a of the hand part 7. Next, similar to the case described with reference to FIG. 3(*b*) through FIG. 3(*d*), the arm part 6 is turned in a counterclockwise direction around the connection point "Z" by the arm part motor 51, and the upper support frame 7a of the hand part 7 is turned in a clockwise direction around the connecting shaft 6c by the upper support frame motor 6b. As a result, the work-piece 30 is taken out (FIG. 5(*b*)). After that, the arm part 6 is turned in the clockwise direction around the connection point "Z" by a predetermined angle together with the upper support frame 7a of the hand part 7 in an integral manner and the orientation of the upper support frame 7a of the hand part 7 is reversed by 180° from a downward orientation to an upward orientation (FIG. 5(*c*)). Lastly, the arm part 6 is turned in the counterclockwise direction around the connection point "Z" by the arm part motor 51, and the upper support frame 7a of the hand part 7 is turned in the clockwise direction around the connecting shaft 6c by the upper support frame motor 6b. As a result, the work-piece 30 is placed in a right side upper cassette in the drawing (FIG. 5(d)).

As described above, another mechanical operation of the articulated robot 1 has been described with reference to FIG. 4 and FIG. 5. However, a work-piece 30 can be carried, for example, from a left side lower cassette in the drawing to a right side upper cassette in the drawing by moving the connection point "Z" on and along the "x"-axis. More specifically, when the articulated robot 1 is in the state shown in FIG. 4(b), the connection point "Z" is linearly moved in a positive direction of the x-axis and the arm part 6 is turned around the connection point "Z" and the hand part 7 is turned around the connecting shaft 6c. As a result, the articulated robot 1 in the state shown in FIG. 4(b) is changed to the state shown in FIG. 5(c). As described above, when a state of the articulated robot 1 is changed in a flow of FIG. 4(a)→FIG. 4(b)→FIG. 5(c)→FIG. 5(d), the work-piece 30 can be carried from the left side lower cassette in the drawing to the right side upper cassette in the drawing.

As described above, according to FIG. 3 through FIG. 5, it is understood that, even when the arm part 6 and the link mechanism 3 (the base side link part 4 and the arm side link part 5) are controlled with linear interpolation, the connection point "Z" of the arm part 6 is moved at optimal positions and thus rapid speed variation of the arm part 6 and the link mechanism 3 is not required (a singular point is not generated). In other words, in the linear interpolation of FIG. 4(a)→FIG. 4(b), in the linear interpolation of FIG. 4(c)→FIG. 4(d), in the linear interpolation of FIG. 5(a)→FIG. 5(b), in the linear interpolation of FIG. 5(c)→FIG. 5(d), in the linear interpolation of FIG. 3(a)→FIG. 3(b) and, in the linear interpolation of FIG. 3(c)→FIG. 3(d), a singular point that is provided in the conventional articulated robot is not generated. Therefore, occurrence of vibration in the arm part 6 and the link mechanism 3 can be prevented and thus the work-piece 30 can be carried stably.

Further, according to FIG. 3 through FIG. 5, a work-piece can be stably carried with simple control by turnably controlling the base side link part 4, the arm part 6 and the hand part 7 respectively (in other words, especially, by not turnably controlling the arm side link part 5 of the link mechanism 3).

Another embodiment of the present invention will be described below with reference to the accompanying drawings. In this second embodiment, the same notational symbols are used in the same structure as the embodiment described above.

FIG. 6 is a sectional view showing an articulated robot 71 in accordance with another embodiment of the present invention. Specifically, FIG. 6(a) is a planar sectional view showing the articulated robot 71 and FIG. 6(b) is a longitudinal sectional view showing the articulated robot 71.

In FIG. 6(a) and FIG. 6(b), the articulated robot 71 includes a base 2, a link mechanism 73, an arm part 6 and a hand part 7. The link mechanism 73 is provided with a base side link part 74 and an arm side link part 75 which are turnably connected with each other.

The base 2 includes an elevating/lowering cylinder 8 moving up and down in a vertical direction by rotation of an elevating/lowering motor (not shown). In this embodiment, the elevating/lowering cylinder 8 is guided by a guide shaft (not shown) to move up and down where a vertical direction in the drawing is a longitudinal direction.

The base side link part 74 is connected with the elevating/lowering cylinder 8 through a connecting shaft 8b and held so as to be capable of turning by a link mechanism motor 8a which is built in the elevating/lowering cylinder 8. Further, the base side link part 74 is moved up and down to the base 2 along with moving up and down of the elevating/lowering cylinder 8.

A base side pulley 74a, an arm side pulley 74b and a belt 74c are built in the base side link part 74. Further, the arm side pulley 74b and the arm side link part 75 are connected with each other by the connecting shaft 74d. Therefore, when a turning angle ratio between the base side pulley 74a and the arm side pulley 74b, in other words, a turning angle ratio between the base side link part 74 and the arm side link part 75 is appropriately adjusted, in the link mechanism 73, a moving trajectory of a center point (connection point "Z") of the connecting shaft 75a which turnably connects the arm side link part 75 with the arm part 6 is controlled on a predetermined straight line.

The arm part 6 is connected with the tip end of the arm side link part 75 through the connecting shaft 75a and held so as to be capable of turning by an arm part motor 751 which is built in the arm side link part 75. In FIG. 6, for convenience of description, the arm part motor 751 is built in the arm side link part 75 but the present invention is not limited to this structure. For example, the arm part motor 751 may be built in the arm part 6 or it may be disposed anywhere.

The hand part 7 is structured of an upper support frame 7a and a lower support frame 7b which are disposed in parallel to each other. The upper support frame 7a and the lower support frame 7b are connected with the tip end of the arm part 6 through a connecting shaft 6c and a connecting shaft 6d respectively and they are held so that they can be turned by a lower support frame motor 6a and an upper support frame motor 6b which are respectively built in the arm part 6.

In this embodiment, control signals for driving the elevating/lowering motor (not shown), the link mechanism motor 8a, the arm part motor 751, the lower support frame motor 6a and the upper support frame motor 6b are appropriately transmitted from a computer (not shown) on the basis of programs which are inputted by an operator.

FIG. 7 is an explanatory view for explaining a mechanical operation of the articulated robot 71 in accordance with another embodiment of the present invention. In FIG. 7, an operation will be described in which a work-piece (for example, a circular semiconductor wafer) 30 is taken out from a cassette 40a to put in a cassette 40d which is apart from the cassette 40a by "3p" in a rightward direction in the drawing. FIG. 7 shows a state where the work-piece 30 is taken out from the cassette 40a (the articulated robot 71 on a left side in the drawing) and a state before the work-piece 30 is placed in the cassette 40d (the articulated robot 71' on a right side in the drawing). In this embodiment, the cassettes 40a through 40d are target positions where the work-piece 30 is carried out or carried in and, when the position of carrying into and carrying out is defined, a processing apparatus may be adopted instead of the cassette.

In FIG. 7, a length of the base side link part 74 is set to be "L1", a length of the arm side link part 75 is set to be "L2", a length of the arm part 6 is set to be "L3", and intervals of four cassettes 40a through 40d are respectively set to be "P". Further, a radius on the arm side (see FIG. 6) of the base side link part 74 is set to be "R1". In addition, a practical area in which the articulated robot 71 is capable of loading and unloading in and from the cassettes 40a through 40d is set to be about 2×(L1+L2) at the maximum.

In FIG. 7, the work-piece 30 is placed on the tip end of the upper support frame 7a of the articulated robot 71 on a left side in the drawing. In this embodiment, the lower support frame 7b of the hand part 7 is not used in this operation and thus it is set in a bent state as shown in the drawing.

The upper support frame 7a of the hand part 7 is linearly moved in a positive direction of the "y"-axis while keeping its orientation in order to take out the work-piece 30 from the cassette 40a. More specifically, the arm part 6 is turned in a clockwise direction around the connection point "Z" by the arm part motor 51 and the upper support frame 7a of the hand part 7 is turned in a counterclockwise direction around the connecting shaft 6c by the upper support frame motor 6b. In this case, a moving trajectory of the connection point "Z" becomes a straight line in a direction perpendicular to the unloading direction of the work-piece 30 (positive direction of the "x"-axis). When the upper support frame 7a of the hand part 7 has been moved in the positive direction of the "y"-axis by a predetermined distance, taking out of the work-piece 30 from the cassette 40a is completed.

Next, it will be described that this work-piece 30 is loaded into the cassette 40d.

First, the connection point "Z" is linearly moved in a positive direction of the "x"-axis. In this case, the connection point "Z" is linearly moved while the arm part 6 is turned around the connection point "Z" and the hand part 7 is turned around the connecting shaft 6c. As a result, the upper support frame 7a can be moved to a position just before the cassette 40d (see the articulated robot 71' on a right side in the drawing). In this embodiment, in the articulated robot 71' on the right side in the drawing, the lower support frame 7b is overlapped with the upper support frame 7a.

After that, the arm part 6 is turned in a clockwise direction around the connection point "Z" by the arm part motor 751 and the upper support frame 7a of the hand part 7 is turned in a counterclockwise direction around the connecting shaft 6c by the upper support frame motor 6b. As a result, the upper support frame 7a of the hand part 7 is entered into the cassette 40d. In this case, a moving trajectory of the connection point "Z" becomes a straight line in a direction perpendicular to the loading direction of the work-piece 30 (negative direction of the "x"-axis). After the upper support frame 7a of the hand part 7 has moved by a predetermined distance in the negative direction of the "y"-axis, the work-piece 30 is placed in the cassette 40d.

As described above, according to FIG. 7, even when the arm part 6 and the link mechanism 73 (the base side link part 74 and the arm side link part 75) are controlled with linear interpolation, the connection point "Z" of the arm part 6 is controlled to move at optimal positions and thus rapid speed variation of the arm part 6 and the link mechanism 73 is not required (singular point is not generated). In the linear interpolation when the work-piece 30 is taken out from the cassette 40a and in the linear interpolation when the work-piece 30 is placed in the cassette 40d, a singular point generated in the conventional articulated robot is not generated. Therefore, occurrence of vibration in the arm part 6 and the link mechanism 73 can be prevented and thus the work-piece 30 can be carried stably.

Further, as shown in FIG. 7, the length "L" of the base side link part 74 is set to be longer than the length "L2" of the arm side link part 75. In addition, the base 2 of the link mechanism 73 is disposed in a state that the center position of the base 2 is shifted by "A" on a side of the work-piece 30 (placed in the cassettes 40a through 40d) from the moving trajectory of the base end side (the connection point "Z") of the arm part, in other words, that the center position of the base 2 is shifted by "A" on a side of a target position where a work-piece 30 in the cassettes 40a through 40d, a processing apparatus or the like is carried out or carried in. Therefore, for example, in this embodiment, the articulated robot 71 is corresponded to four series cassettes in which four cassettes are adjacently disposed to enhance efficiency, and occupancy distance in a direction where the work-piece 30 is loaded/unloaded in/from the cassettes 40a through 40d (direction of the "y"-axis) is shortened and thus required space can be reduced. The distance "A" by which the center position of the base 2 of the link mechanism 73 is shifted to the side of the target position where the work-piece 30 in the cassette, the processing apparatus or the like is carried in or carried out can be set at a position for optimizing a space according to a process where the articulated robot 71 is disposed. For example, in FIG. 7, when processing apparatuses or other cassettes are arranged and disposed on an upper side in the drawing so as to face the cassettes 40a through 40d, the "A" may be shifted in a direction shown by the arrow "Y". In other words, when the work-piece 30 is carried between the cassettes 40a through 40d and the processing apparatus and another cassette on the upper side, a similar space saving effect can be obtained even when the center position of the base 72 of the link mechanism 73 is shifted either of the upper and lower directions in the drawing. Further, the "A" may be set to be zero if necessary.

In addition, since it is set that "L1">"L2", movement can be performed from the cassette 40a to the cassette 40d quickly and thus time efficiency can be improved. Further, a weight of the arm side link part 75 is lighter than that of the base side link part 74 and thus the work-piece can be stably carried while vibration is prevented.

Further, according to FIG. 7, a work-piece can be stably carried with a simple control by turnably controlling the base side link part 74, the arm part 6 and the hand part 7 respectively (in other words, by especially not turnably controlling the arm side link part 75 of the link mechanism 73). In this embodiment, four series cassettes in which four cassettes are adjacently disposed are shown but the present invention is not limited to this embodiment. Four or more cassettes may be used or three or less cassettes may be used.

EXAMPLES

FIG. 8 is an explanatory view for explaining linearity of the connection point "Z" in the articulated robot 71 in accordance with another embodiment of the present invention. Especially, FIG. 8(a) is a plan view showing the articulated robot 71 and FIG. 8(b) shows an error in the "y"-axis direction when the connection point "Z" is moved in a positive direction of the "x"-axis.

In FIG. 8(a), the practical area "2×(L1+L2)" described above is about ±670 mm.

Therefore, when the error in this practical area is small to some extent, the articulated robot 71 is recognized to be practical.

In FIG. 8(b), when the "X" coordinate is at positions of 100 mm or less, there is almost no error but, when the "X" coordinate becomes larger than 100 mm, there is a little error. However, in the practical area of about from −670 mm to 670 mm, the error is about 3 mm at the maximum, which may be negligible from a practical viewpoint. Therefore, the articulated robot 71 is provided with usefulness. The area of about from −670 mm to 670 mm is one example, and it may be changed according to arrangement of practically used cassettes or a space in a direction loading/unloading a work-piece in/from a cassette.

The articulated robot in accordance with the present invention is useful as a robot which is capable of carrying a work-piece such as a semiconductor wafer stably with a simple control and without using an expensive motor generating a large driving force. In addition, the articulated robot in accordance with the present invention is useful as a robot which is capable of stably carrying a work-piece such as a semiconductor wafer and reducing installation space.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

What is claimed:

1. An articulated robot for loading/unloading a work-piece to/from a cassette comprising:
   a hand part for holding the work-piece;
   an arm part which turnably holds the hand part;
   a link mechanism which comprises:
      a base side link part which is disposed on a base end side of the articulated robot; and
      an arm side link part which is disposed on a side of the arm part;
      wherein the arm side link part is connected with the base side link part and turnably holds a base end side of the arm part; and
   wherein the link mechanism is configured to operate so that a moving trajectory of a connection point of the arm part with the arm side link part is controlled on a straight line in a direction substantially perpendicular to a loading/unloading direction of the work-piece to/from the cassette; and
   a drive means for moving the arm part so as to perform linear interpolation in the loading/unloading direction while matching with movement of the link mechanism.

2. The articulated robot according to claim 1;
   wherein lengths of the base side link part and the arm side link part are substantially the same, and a turning angle ratio between the base side link part and the arm side link part is 1:2.

3. The articulated robot according to claim 1;
   wherein a length of the base side link part is formed longer than a length of the arm part side link part; and a base of the link mechanism is disposed in a state that a center position of a base of the link mechanism is shifted from the moving trajectory of the base end side of the arm part.

4. The articulated robot according to claim 3;
   wherein the base of the link mechanism is disposed in a state that the center position of the base of the link mechanism is shifted on a side to the cassette or on a side to a target position where the work-piece is carried in or carried out from the moving trajectory of the base end side of the arm part.

\* \* \* \* \*